(12) United States Patent
Davis

(10) Patent No.: US 6,724,928 B1
(45) Date of Patent: Apr. 20, 2004

(54) REAL-TIME PHOTOEMISSION DETECTION SYSTEM

(75) Inventor: Brennan V. Davis, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/496,532

(22) Filed: Feb. 2, 2000

Related U.S. Application Data

(60) Provisional application No. 60/168,584, filed on Dec. 2, 1999.

(51) Int. Cl.[7] .................. G06K 9/00; G01R 31/302; G01R 31/26
(52) U.S. Cl. .................. 382/145; 324/750; 324/765
(58) Field of Search .................. 382/141, 144, 382/145, 147, 149; 324/750, 752, 765

(56) References Cited

U.S. PATENT DOCUMENTS

| | | | | | |
|---|---|---|---|---|---|
| 3,867,697 | A | * | 2/1975 | Vanzetti et al. ............. | 324/752 |
| 5,642,054 | A | * | 6/1997 | Pasiecznik, Jr. ............ | 324/754 |
| 5,719,669 | A | * | 2/1998 | Ross, III .................... | 356/124 |
| 5,754,227 | A | * | 5/1998 | Fukuoka .................. | 348/231.6 |
| 5,971,608 | A | * | 10/1999 | Koizumi ...................... | 374/5 |
| 5,986,263 | A | * | 11/1999 | Hiroi et al. ................. | 250/310 |
| 6,020,746 | A | * | 2/2000 | Livengood .................. | 324/754 |
| 6,107,107 | A | * | 8/2000 | Bruce et al. ................... | 438/14 |
| 6,222,187 | B1 | * | 4/2001 | Shivanandan ............... | 250/330 |
| 6,225,620 | B1 | * | 5/2001 | Campbell et al. ........... | 250/221 |
| 6,335,629 | B1 | * | 1/2002 | Lee et al. .................... | 324/755 |

OTHER PUBLICATIONS

T. Ishii and K. Miyamoto, Functional Failure Analysis of Logic LSIs from Backside of the Chip and Its Verification by Logic Simulation, Proceedings of 20th International Symposium for Tesing and Failure Analysis (ISFTA), 1994, pp. 41–47.*

N.M. Wu et al., Failure Analysis from Back side of Die, ISTFA, 1996, pp. 393–399.*

Jeong–Seon Seo et al., Intelligent Defect Localization Mehodology Through the use of Photoemission Spectral Analysis, ISTFA, 1995, pp. 22–27.*

Kim et al., "A Monolithically Integrated InGaAs–InP p–i–n/ JFET Focal Plane Array," 1996, IEEE, pp. 566–568.*

Ettenberg et al., "A 2mm Cutoff 320×240 InGaAs NIR Camera," 1998, IEEE, pp. 71–72.*

Mano et al., "New Self–organized Growth Method for InGaAs Quantum Dots on GaAs(001) Using Droplet Epitaxy," 1999, Publication board, Japanese Journal of Applied Physics, pp. 1009–1011.*

Lacaita et al., "Single–poton Detection Beyond 1mm : Performance of Commenrcially Available InGaAs/InP Detectors," 1996, Applied Optics, pp. 2986–2996.*

* cited by examiner

*Primary Examiner*—Daniel Mariam
*Assistant Examiner*—Shefali Patel

(57) ABSTRACT

Post-manufacturing analysis of a semiconductor chip is enhanced via a method and system for viewing emissions through substrate in the back side of the chip. According to an example embodiment of the present invention, a portion of circuitry in a semiconductor chip is excited, and an emission is generated. An optical microscope is directed at the backside of the chip, and an image of the emission is obtained. The optical microscope is coupled to an indium-gallium-arsenic (InGaAs) camera that is used to detect the emission. In this manner, emissions can be detected through substrate in a semiconductor chip.

33 Claims, 2 Drawing Sheets

REAL-TIME PHOTOEMISSION DETECTION SYSTEM

RELATED PATENT APPLICATIONS

This application claims the benefit of U.S. Provisional Application Serial No. 60/168,584, filed on Dec. 2, 1999 (AMDA.446P1), and entitled "Real-Time Photoemission Detection System".

FIELD OF THE INVENTION

The present invention relates generally to semiconductor devices and their fabrication and, more particularly, to semiconductor devices and their manufacture involving techniques for analyzing and debugging circuitry within an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. The demand for increasing operating speed and decreasing package sizes continues to drive improvements in these areas, and continues to make semiconductor manufacturing processes more challenging.

As the manufacturing processes for semiconductor chips and integrated circuits increase in difficulty, methods for testing and debugging become increasingly important. Not only is it important to ensure that individual chips are functional, it is also important to ensure that batches of chips perform consistently. In addition, the ability to detect a defective manufacturing process early is helpful for reducing the number of defective chips manufactured.

Traditionally, semiconductor chips and integrated circuits have been tested using methods including directly accessing circuitry or devices within the chip or integrated circuit. In addition, many methods require the circuit to be powered. Directly accessing the circuitry is difficult for several reasons. For instance, in flip-chip type dies, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip.

Since access to the transistors and circuitry in flip-chips is generally from the back side of the chip, it is often necessary to mill through the back side and probe certain circuit elements in order to test the device. Milling through the back side is often difficult and time consuming. Moreover, circuitry and devices in the integrated circuit may potentially be damaged by milling processes. The difficulty, cost, and destructive aspects of existing methods for testing integrated circuits are impediments to the growth and improvement of semiconductor technologies.

SUMMARY OF THE INVENTION

The present invention is directed to a method and system for post-manufacturing analysis of a semiconductor chip involving real-time detection of emissions from the chip. The present invention is exemplified in a number of implementations and applications, some of which are summarized below.

According to an example embodiment of the present invention, a semiconductor chip is analyzed using an InGaAs camera coupled to an optical microscope. The chip has a back side opposite a circuit side, the back side includes silicon substrate, and the circuit side includes circuitry. A portion of the circuitry is excited and an emission such as a photoemission or a thermal emission is generated. The optical microscope coupled to the InGaAs camera is directed at the back side of the chip and used to obtain an image of the emission through the silicon substrate. The image is used for analysis of the semiconductor chip.

According to another example embodiment of the present invention, a system is adapted to analyze a semiconductor chip having a back side opposite a circuit side, wherein the back side includes silicon substrate and the circuit side includes circuitry. An excitation arrangement is adapted to excite a portion of the circuitry. A microscope arrangement is arranged over the chip and is adapted to obtain an image from the chip. An InGaAs camera arrangement is coupled to the microscope and is adapted to obtain and record the image data from the microscope arrangement.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
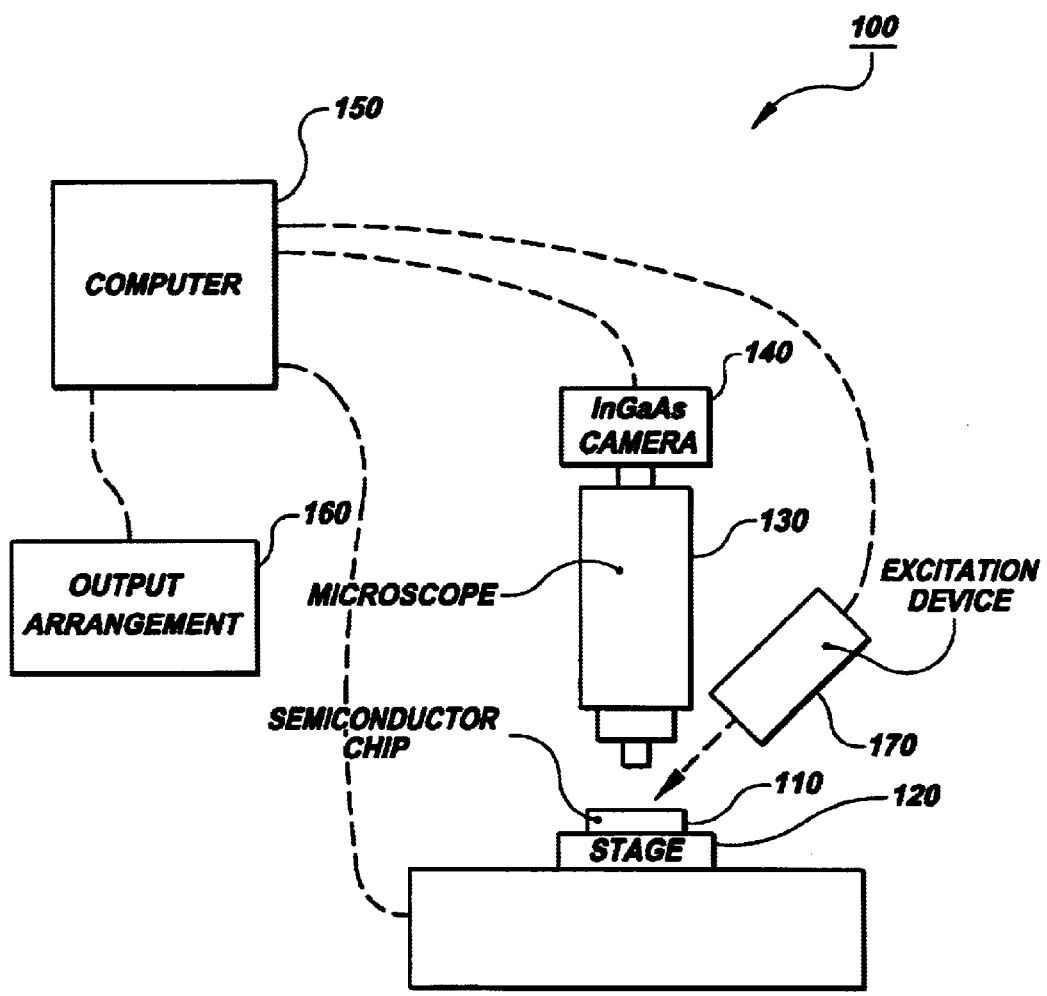
FIG. 1 is a system for analyzing a semiconductor chip, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor chips, and the invention has been found to be particularly suited for flip-chip and other type devices requiring or benefiting from post-manufacturing analysis involving the monitoring of emissions from the back side. While the present invention is not necessarily limited to such applications, various aspects of the invention may be appreciated through a discussion of various examples using this context.

According to an example embodiment of the present invention, an indium-gallium-arsenic (InGaAs) camera such as that available from Sensors Unlimited, Inc. of Princeton, N.J., is used in connection with an optical microscope to detect emissions from the back side of a semiconductor chip. The emissions, such as photoemissions, thermal emissions, or other radiation, result from the excitation of a portion of circuitry in the chip. The use of the InGaAs camera provides the ability to detect and image such emissions through silicon substrate in the back side of a semiconductor chip.

FIG. 1 shows an example system 100 for detecting emissions from a semiconductor chip, according to another example embodiment of the present invention. A semiconductor chip 110 is mounted on a stage 120. An optical microscope 130 is arranged over the chip 10 and is coupled to an InGaAs camera 140. The microscope 130 is used to obtain images from the chip 110, and the camera 140 records the images obtained by the microscope 130. In a more particular example embodiment, the microscope 130 includes an infrared (IR) objective lens. Optionally, the camera is controlled using a gain control for sensitivity for adjusting the obtained image.

Figure 2:
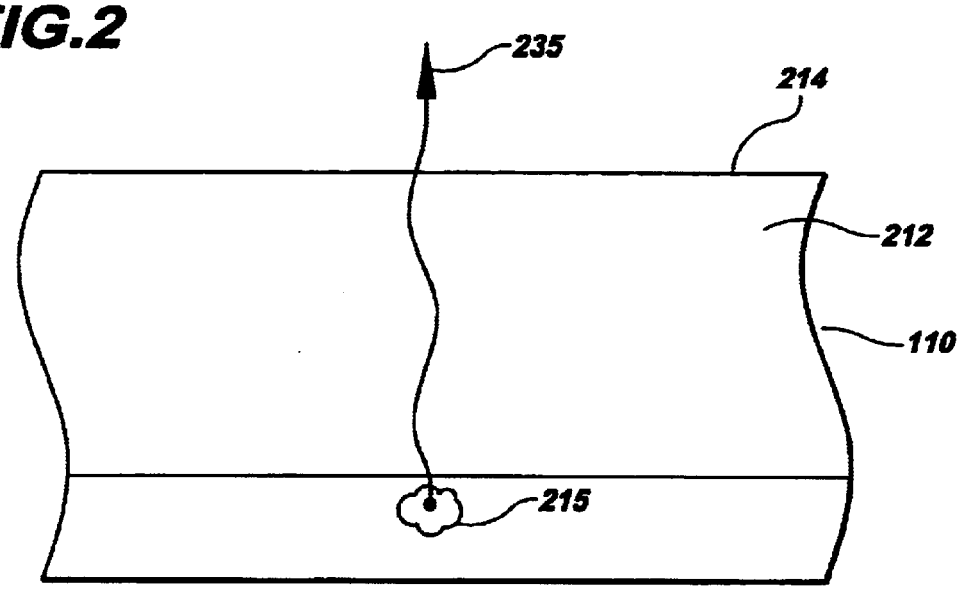
FIG. 2 is a semiconductor chip undergoing analysis in conjunction with an example embodiment of the present invention.

FIG. 2 shows the semiconductor chip 110 having circuitry 215 generating an emission 235. The emission 235 passes through silicon substrate 212 in the back side of the chip 110. Using the optical microscope 130 of FIG. 1, the emission 235 can be detected and analyzed.

In another example embodiment, the camera 140 is coupled to a computer arrangement 150 adapted for use in the test system 100. For example, the computer arrangement can be used to control the camera using camera control software and/or hardware. The computer can also be used for image analysis and processing, such as using frame grabber software and/or hardware. In another example, the computer arrangement is adapted for controlling the excitation of the chip 110. The chip can be excited by directly coupling to the chip, such as by coupling energy to the chip via an energy supply in the stage 120. The chip can also be excited by coupling energy indirectly using arrangement 170 to direct energy, such as an optical beam, electron beam, or ion beam at the chip 110. Alternatively, the excitation of the chip may be accomplished independently of the computer arrangement 150, or using a separate controller arrangement.

In another example embodiment, an arrangement 160 for displaying information regarding the image obtained is coupled to the computer arrangement 150. The arrangement 160 may include, for example, a video monitor, a printer, or an oscilloscope. The image of the emission can be displayed and used for analysis of the semiconductor chip. In addition, other data such as intensity, location, or wavelength data regarding the emission can be displayed or printed for viewing using the arrangement 160.

In another example embodiment, the stage 120 includes a test fixture adapted for testing the chip 110. The test fixture is used in combination with the stage to hold the chip in place and analyze the chip. The test fixture may include the energy supply described above as coupled to the computer arrangement 150, or may include an independent energy supply. The test fixture may also include a probestation, such as that manufactured by Alessi. The test fixture may also include analysis equipment, such as measurement devices coupled and arranged for obtaining a signal or electrical measurement from the chip.

An excitation device 170 is arranged over the chip 110 and used to direct energy at the chip and to excite circuitry within the chip, according to another example embodiment of the present invention. As described above, the excitation device 170 may be coupled to and controlled by the computer arrangement 150. Examples of such devices include an electron-beam generating device, an optical-beam generating device, and an ion-beam generating device. These devices can be directed at circuitry in the chip and used to cause a reaction resulting in an emission detectable by the InGaAs camera. For instance, a laser beam can be used to induce current in the chip. The current generates a reaction, such as the creation of a photoemission or heat, that can be imaged with the InGaAs camera.

According to another example embodiment of the present invention, silicon substrate in the back side of the semiconductor chip 110 is polished prior to detecting an emission from the chip. The chip may be polished using conventional methods, such as using a chemical-mechanical polishing (CMP) apparatus. Referring to FIG. 2, the back side surface 214 can be polished using one of these methods, improving the ability to obtain image or other data from the chip.

Figure 3:
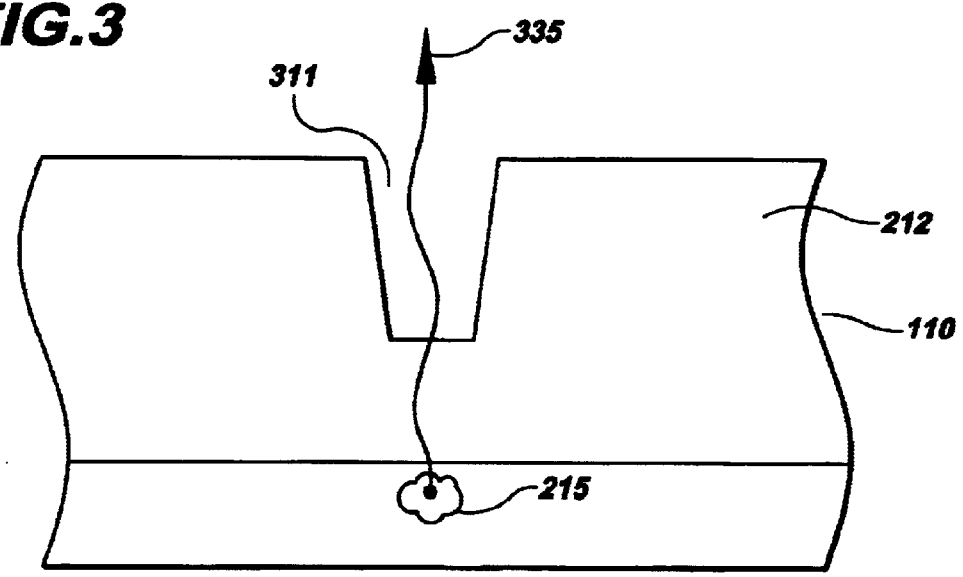
FIG. 3 is another semiconductor chip undergoing analysis in conjunction with another example embodiment of the present invention.

Substrate is removed from the back side of the semiconductor chip 110, according to another example embodiment of the present invention. The removal of substrate allows the detection and imaging of emissions having passed through less silicon substrate, and the amount of substrate removal can be optimized to obtain desired images or other results. The substrate may be removed using, for example, CMP, a focused ion beam (FIB), or other conventional etching or milling process. In one example application of the present invention, substrate is thinned locally over a portion of chip circuitry for which testing is desired. FIG. 3 shows such local thinning in a portion 311 of the silicon substrate 212 in the back side of the chip 110, wherein emission 335 passes from circuitry 215 through thinned substrate in the back side prior to exiting the chip. After the substrate is locally thinned, the optical microscope is directed at the exposed portion of the back side of the chip and used to detect emissions, such as emission 335. In another example application of the present invention, the substrate is globally removed across the back side of the chip. In still another example application of the present invention, a combination of global and local substrate removal processes are used to thin the back side of the chip.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor chip having a back side opposite a circuit side, wherein the back side includes silicon substrate and the circuit side includes circuitry, the method comprising:

providing an optical microscope arrangement that includes an InGaAs camera;

exciting a portion of circuitry in the semiconductor chip;

directing the optical microscope arrangement at the back side of the chip and obtaining an image; and using the InGaAs camera, detecting an emission from the semiconductor chip.

2. The method of claim 1, further comprising:

coupling a computer arrangement to the camera; and using the computer arrangement, analyzing the detected emission.

3. The method of claim 2, further comprising:

coupling a video monitor to the computer arrangement; and displaying data at the video monitor representing the detected emission.

4. The method of claim 2, further comprising:

controlling the camera via the computer arrangement.

5. The method of claim 2, wherein analyzing the detected emission includes analyzing the image using frame-grabber image analysis software and hardware.

6. The method of claim 2, further comprising:

coupling a printer arrangement to the computer arrangement; and printing data representing the detected emission.

7. The method of claim 1, further comprising:

arranging the semiconductor in a test fixture.

8. The method of claim 7, wherein the test fixture includes a probe station.

9. The method of claim 1, wherein exciting a portion of circuitry in the semiconductor chip comprises:

coupling the chip to a power supply; and powering the chip.

10. The method of claim 1, wherein exciting a portion of circuitry in the semiconductor chip comprises;

arranging an electron beam generating device over the semiconductor chip; and directing an electron beam at the back side of the chip.

11. The method of claim 1, wherein exciting a portion of circuitry in the semiconductor chip comprises;

arranging an ion beam generating device over the semiconductor chip; and directing an ion beam at the back side of the chip.

12. The method of claim 1, wherein exciting a portion of circuitry in the semiconductor chip comprises;

arranging an optical beam generating device over the semiconductor chip; and directing an optical beam at the back side of the chip.

13. The method of claim 1, wherein using the InGaAs camera and detecting an emission from the semiconductor chip includes detecting an emission passing through the silicon substrate.

14. The method of claim 1, wherein directing an optical microscope at the back side of the chip and obtaining an image includes using an IR objective lens.

15. The method of claim 1, wherein the emission includes radiation.

16. The method of claim 1, wherein the emission includes a photoemission.

17. The method of claim 1, wherein the emission includes a thermal emission.

18. The method of claim 1, further comprising:

thinning the silicon substrate in the back side of the chip prior to obtaining an image.

19. The method of claim 1, further comprising:

polishing the back side of the chip prior to obtaining an image.

20. A system for analyzing a semiconductor chip having a back side opposite a circuit side, wherein the back side includes silicon substrate and the circuit side includes circuitry, the system comprising:

means for exciting a portion of circuitry in the semiconductor chip; and means, including an InGaAs camera arrangement directed toward the back side of the chip, for obtaining an image and providing image data to the camera arrangement.

21. A system for analyzing a semiconductor chip having a back side opposite a circuit side, wherein the back side includes silicon substrate and the circuit side includes circuitry, the system comprising:

an excitation arrangement adapted to excite a portion of the circuitry; and a microscope arrangement including an InGaAs camera arrangement directed toward the back side of the chip, and adapted to obtain an image and adapted to obtain the image data from the microscope arrangement.

22. The system of claim 21, further comprising:

a computer arrangement coupled to the InGaAs camera arrangement and adapted to receive and process the image data.

23. The system of claim 22, further comprising:

a visual output arrangement, coupled to the computer arrangement and adapted to present data from the computer arrangement for visual analysis.

24. The system of claim 23, wherein the visual output arrangement includes at least one of: a video monitor and a printer.

25. The system of claim 22, wherein the computer arrangement includes image analysis software.

26. The system of claim 25 wherein the software includes frame grabber software.

27. The system of claim 22, wherein the computer arrangement includes image analysis hardware.

28. The system of claim 21, further comprising a test arrangement adapted to hold the semiconductor chip.

29. The system of claim 28, wherein the test arrangement includes a probe station.

30. The system of claim 28, wherein the test arrangement includes the excitation arrangement.

31. The system of claim 21, wherein the excitation arrangement includes at least one of: a power supply electrically coupled to the semiconductor chip; an optical beam generating arrangement adapted to direct an optical beam at the back side of the semiconductor chip; an ion beam generating arrangement adapted to direct an ion beam at the back side of the semiconductor chip; and an electron beam generating arrangement adapted to direct an electron beam at the back side of the semiconductor chip.

32. The system of claim 21, wherein the microscope arrangement includes an IR objective lens.

33. The system of claim 21, wherein the InGaAs camera arrangement includes a gain control for sensitivity.

* * * * *